United States Patent
Yoshitomi (10) Patent No.: US 9,692,430 B2
(45) Date of Patent: Jun. 27, 2017

(54) ELECTRICAL CHARACTERISTIC ADJUSTMENT DEVICE AND ELECTRICAL CHARACTERISTIC ADJUSTMENT METHOD

(71) Applicant: ANRITSU CORPORATION, Atsugi-shi, Kanagawa (JP)

(72) Inventor: Keiichi Yoshitomi, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 0 days.

(21) Appl. No.: 14/570,759

(22) Filed: Dec. 15, 2014

(65) Prior Publication Data

US 2015/0261407 A1    Sep. 17, 2015

(30) Foreign Application Priority Data

Mar. 12, 2014  (JP) ................................ 2014-048766

(51) Int. Cl.
*H03L 7/197* (2006.01)

(52) U.S. Cl.
CPC .......... *H03L 7/197* (2013.01); *H03J 2200/09* (2013.01)

(58) Field of Classification Search
CPC ..... G06F 3/0488; G06F 3/04845; G06F 3/038
See application file for complete search history.

(56) References Cited

U.S. PATENT DOCUMENTS

| 7,080,324 | B1* | 7/2006 | Nelson | G06F 3/04847 715/771 |
| 2002/0063737 | A1* | 5/2002 | Feig | G06F 3/04847 715/786 |
| 2009/0306794 | A1* | 12/2009 | Eischeid | G06F 3/04847 700/75 |
| 2013/0322848 | A1* | 12/2013 | Li | H04N 5/783 386/241 |

FOREIGN PATENT DOCUMENTS

JP           59-023633 A      2/1984

* cited by examiner

*Primary Examiner* — Amare Mengistu
*Assistant Examiner* — Sarvesh J Nadkarni
(74) *Attorney, Agent, or Firm* — Pearne & Gordon LLP (57) ABSTRACT

A frequency adjustment device 10 includes an operation unit 14 that inputs data for a first minimum value and a first maximum value indicating a target range of a characteristic value, a fine adjustment mark display unit 24 that displays a frequency value with a first mark for fine adjustment at a position relative to a first axis which extends from a first minimum value to a first maximum value, a coarse adjustment mark display unit 22 that displays the frequency value with a second mark for coarse adjustment at a position relative to a second axis which extends from a second minimum value to a second maximum value, and a medium adjustment mark display unit 23 that displays the frequency value with a third mark for medium adjustment at a position relative to a third axis which extends from a third minimum value to a third maximum value.

11 Claims, 10 Drawing Sheets

ELECTRICAL CHARACTERISTIC ADJUSTMENT DEVICE AND ELECTRICAL CHARACTERISTIC ADJUSTMENT METHOD

TECHNICAL FIELD

The present invention relates to an electrical characteristic adjustment device and an electrical characteristic adjustment method that can adjust a predetermined characteristic value of a device to be adjusted, which can change an electrical characteristic, within a target range.

BACKGROUND ART

As this type of device, an FM demodulation situation display device is disclosed in Patent Document 1.

The FM demodulation situation display device disclosed in Patent Document 1 includes a display device that displays the frequency of an input FM signal when FM signal tuning adjustment is performed. The display device has a structure in which nine display units including one green display unit that emits green light and eight red display units that emit red light are arranged in a line in the horizontal direction. The green light emission unit is interposed between four right red light emission units and four left red light emission units and is disposed at the center of the display device.

The green light emission unit emits light when the center frequency of an input signal is within the target range (fc±Δfc) of a predetermined center frequency fc. When the center frequency of the input signal is less than (fc−Δfc), the four left red light emission units emit light according to the frequency. When the center frequency of the input signal is greater than (fc+Δfc), the four right red light emission units emit light according to the frequency.

According to this structure, the FM demodulation situation display device disclosed in Patent Document 1 can display the FM signal tuning adjustment such that the user can easily recognize it.

RELATED ART DOCUMENT

Patent Document

[Patent Document 1] Japanese Unexamined Patent Application Publication No. 59-023633

DISCLOSURE OF THE INVENTION

Problem that the Invention is to Solve

However, in the FM demodulation situation display device disclosed in Patent Document 1, it is difficult to adjust the frequency, depending on the target range of the adjustment frequency.

Specifically, in devices requiring a high performance, such as recent mobile phones, for example, when the frequency is adjusted, the frequency needs to be accurately adjusted in a range of 10 MHz±10 Hz as the target range of the adjustment frequency. In this case, a method which performs coarse adjustment and then performs fine adjustment such that the frequency falls within the target range is effective. However, the FM demodulation situation display device disclosed in Patent Document 1 does not have a coarse adjustment structure or a fine adjustment structure and needs to adjust the frequency so as to fall within the range of ±10 Hz from a center frequency of 10 MHz at a time. Therefore, it is difficult to adjust the frequency.

The invention has been made in order to solve the above-mentioned problems and an object of the invention is to provide an electrical characteristic adjustment device and an electrical characteristic adjustment method that enable a user to easily adjust a predetermined characteristic value within a target range with a simple operation.

Means for Solving the Problem

According to a first aspect of the invention, there is provided an electrical characteristic adjustment device (10) for adjusting a characteristic value of an electrical characteristic within a target range. The electrical characteristic adjustment device includes: characteristic value acquisition means (13) for receiving a signal from a device (1) to be adjusted, which can change the electrical characteristic, measuring the signal, and acquiring the characteristic value of the electrical characteristic; target range data input means (14) for inputting data for a first minimum value and a first maximum value indicating the target range of the characteristic value; display means (15) for displaying a mark, which has a predetermined shape and indicates the characteristic value acquired by the characteristic value acquisition means, at a position relative to an axis (35) having a range from a predetermined minimum value to a predetermined maximum value; first display control means (24) for controlling the display means such that a first mark (43) indicating the characteristic value acquired by the characteristic value acquisition means is displayed at a position relative to a first axis (53) which has the first minimum value and the first maximum value as the predetermined minimum value and the predetermined maximum value, respectively; and second display control means (22) for controlling the display means such that a second mark (41) indicating the characteristic value acquired by the characteristic value acquisition means is displayed at a position relative to a second axis (51) which has a second minimum value that is less than the first minimum value and a second maximum value that is greater than the first maximum value as the predetermined minimum value and the predetermined maximum value, respectively.

According to this structure, in the electrical characteristic adjustment device according to the first aspect of the invention, the first display control means displays the characteristic value with the first mark at a position relative to the first axis which extends from the first minimum value to the first maximum value. The second display control means displays the characteristic value with the second mark at a position relative to the second axis which extends from the second minimum value less than the first minimum value to the second maximum value greater than the first maximum value. Therefore, it is possible to perform coarse adjustment and fine adjustment for the characteristic value. As a result, the electrical characteristic adjustment device according to the first aspect of the invention does not need to adjust the characteristic value so as to fall within the target range at a time and enables the user to easily adjust a predetermined characteristic value within the target range with a simple operation.

According to a second aspect of the invention, the electrical characteristic adjustment device may further include third display control means (23) for controlling the display means such that a third mark (42) indicating the characteristic value acquired by the characteristic value acquisition means is displayed at a position relative to a third axis (52) which has a third minimum value that is less than the first minimum value and is greater than the second minimum value and a third maximum value that is greater than the first maximum value and is less than the second maximum value as the predetermined minimum value and the predetermined maximum value, respectively.

According to this structure, the electrical characteristic adjustment device according to the second aspect of the invention further includes the third display control means that displays the characteristic value at a position relative to the third axis extending from the third minimum value that is less than the first minimum value and is greater than the second minimum value to the third maximum value that is greater than the first maximum value and is less than the second maximum value, in addition to the first display control means and the second display control means. Therefore, it is possible to perform coarse adjustment, medium adjustment, and fine adjustment for the characteristic value. As a result, the electrical characteristic adjustment device according to the second aspect of the invention does not need to adjust the characteristic value so as to fall within the target range at a time and enables the user to easily adjust a predetermined characteristic value within the target range with a simple operation.

According to a third aspect of the invention, the electrical characteristic adjustment device may further include fluctuation range calculation means (72) for calculating a fluctuation range of the characteristic value acquired by the characteristic value acquisition means on the first axis. The first display control means (71) may display a mark (73) indicating the fluctuation range.

According to this structure, the electrical characteristic adjustment device according to the third aspect of the invention displays the fluctuation range with a mark. Therefore, even when the characteristic value varies in a predetermined range, the user can easily adjust a predetermined characteristic value within the target range with a simple operation.

According to a fourth aspect of the invention, the electrical characteristic adjustment device may further include notification means (25) for notifying that the characteristic value acquired by the characteristic value acquisition means is within a predetermined adjustment range.

According to this structure, the electrical characteristic adjustment device according to the fourth aspect of the invention can notify the user that the characteristic value is within the adjustment range.

According to a fifth aspect of the invention, there is provided an electrical characteristic adjustment method for adjusting a characteristic value of an electrical characteristic within a target range. The electrical characteristic adjustment method includes: a characteristic value acquisition step (S16) of receiving a signal from a device (1) to be adjusted, which can change the electrical characteristic, measuring the signal, and acquiring the characteristic value of the electrical characteristic; a target range data input step (S11) of inputting data for a first minimum value and a first maximum value indicating the target range of the characteristic value; and a display step (S17, S18, S19) of displaying a mark, which has a predetermined shape and indicates the characteristic value acquired in the characteristic value acquisition step, at a position relative to an axis (35) having a range from a predetermined minimum value to a predetermined maximum value. The display step includes: a first display control step (S19) of performing control such that a first mark (43) indicating the characteristic value acquired in the characteristic value acquisition step is displayed at a position relative to a first axis (53) which has the first minimum value and the first maximum value as the predetermined minimum value and the predetermined maximum value, respectively; and a second display control step (S17) of performing control such that a second mark (41) indicating the characteristic value acquired in the characteristic value acquisition step is displayed at a position relative to a second axis (51) which has a second minimum value that is less than the first minimum value and a second maximum value that is greater than the first maximum value as the predetermined minimum value and the predetermined maximum value, respectively.

According to this structure, in the electrical characteristic adjustment method according to the fifth aspect of the invention, the first display control step displays the characteristic value with the first mark at a position relative to the first axis which extends from the first minimum value to the first maximum value. The second display control step displays the characteristic value with the second mark at a position relative to the second axis which extends from the second minimum value less than the first minimum value to the second maximum value greater than the first maximum value. Therefore, it is possible to perform coarse adjustment and fine adjustment for the characteristic value. As a result, the electrical characteristic adjustment method according to the fifth aspect of the invention does not need to adjust the characteristic value so as to fall within the target range at a time and enables the user to easily adjust a predetermined characteristic value within the target range with a simple operation.

According to a sixth aspect of the invention, in the electrical characteristic adjustment method, the display step may further include a third display control step (S18) of performing control such that a third mark (42) indicating the characteristic value acquired in the characteristic value acquisition step is displayed at a position relative to a third axis (52) which has a third minimum value that is less than the first minimum value and is greater than the second minimum value and a third maximum value that is greater than the first maximum value and is less than the second maximum value as the predetermined minimum value and the predetermined maximum value, respectively.

According to this structure, the electrical characteristic adjustment method according to the sixth aspect of the invention further includes the third display control step of displaying the characteristic value at a position relative to the third axis extending from the third minimum value that is less than the first minimum value and is greater than the second minimum value to the third maximum value that is greater than the first maximum value and is less than the second maximum value, in addition to the first display control step and the second display control step. Therefore, it is possible to perform coarse adjustment, medium adjustment, and fine adjustment for the characteristic value. As a result, the electrical characteristic adjustment method according to the sixth aspect of the invention does not need to adjust the characteristic value so as to fall within the target range at a time and enables the user to easily adjust a predetermined characteristic value within the target range with a simple operation.

According to a seventh aspect of the invention, the electrical characteristic adjustment method may further include a fluctuation range calculation step (S21) of calculating a fluctuation range of the characteristic value acquired in the characteristic value acquisition step on the first axis. The first display control step may display a mark (73) indicating the fluctuation range.

According to this structure, the electrical characteristic adjustment method according to the seventh aspect of the invention displays the fluctuation range with a mark. Therefore, even when the characteristic value varies in a predetermined range, the user can easily adjust a predetermined characteristic value within the target range with a simple operation.

Advantage of the Invention

The invention provides an electrical characteristic adjustment device and an electrical characteristic adjustment method that enable a user to easily adjust a predetermined characteristic value within a target range with a simple operation.

BEST MODE FOR CARRYING OUT THE INVENTION

Hereinafter, embodiments of the invention will be described with reference to the drawings. An example in which an electrical characteristic adjustment device according to the invention is applied to a frequency adjustment device that adjusts the frequency of an output signal from a device to be adjusted will be described.

First Embodiment

First, the structure of a frequency adjustment device as an electrical characteristic adjustment device according to a first embodiment of the invention will be described.

Figure 1:
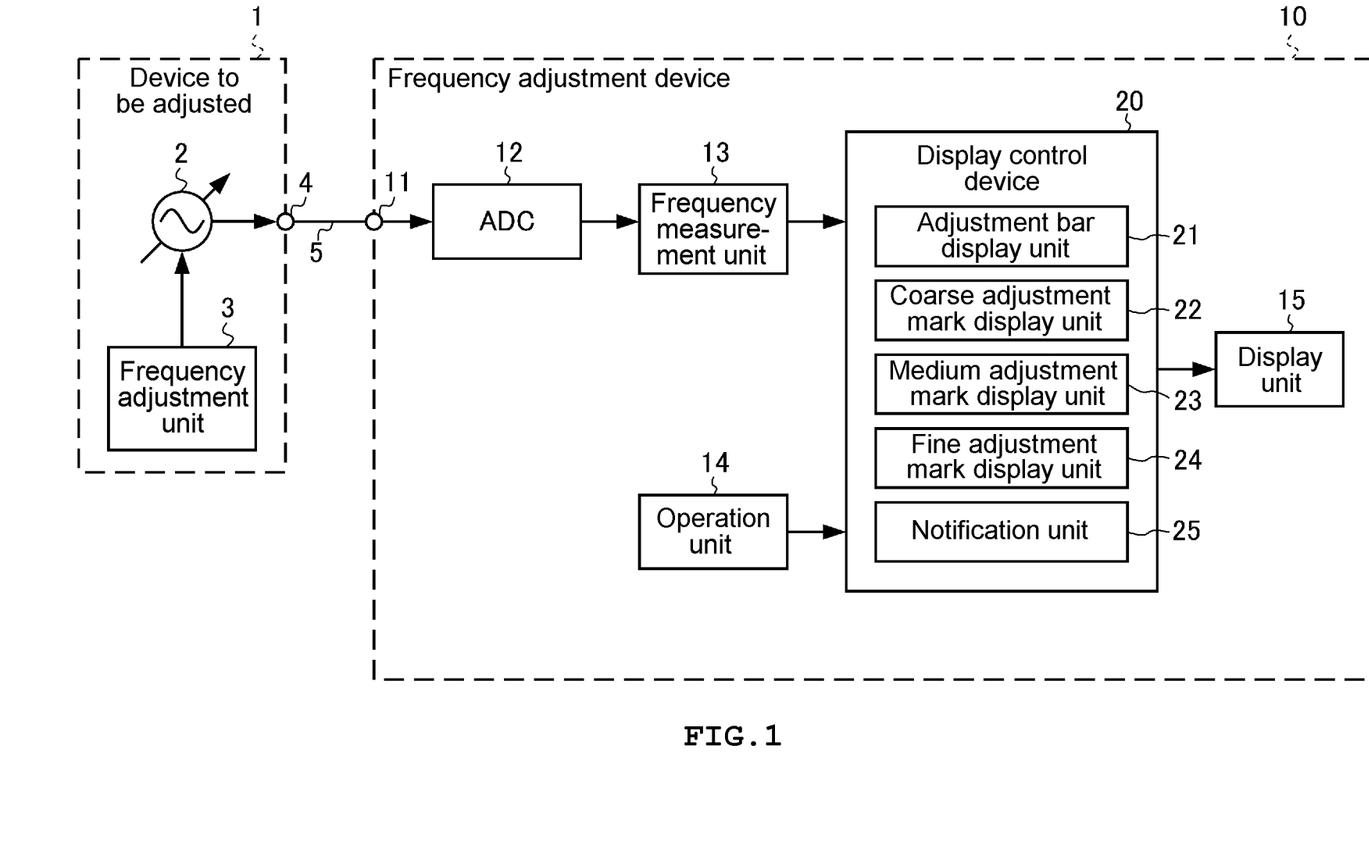
FIG. 1 is a block diagram illustrating the structure of a frequency adjustment device according to a first embodiment of the invention.

As shown in FIG. 1, a frequency adjustment device 10 according to this embodiment adjusts the frequency of a signal output from a device 1 to be adjusted. The device 1 to be adjusted is, for example, a mobile phone and includes an oscillator 2 that generates a signal with a predetermined oscillating frequency, a frequency adjustment unit 3 that adjusts the oscillating frequency of the oscillator 2, and an output terminal 4. A user can adjust the frequency adjustment unit 3 to change the frequency of the output signal from the device 1 to be adjusted.

The output terminal 4 is connected to the frequency adjustment device 10 through a coaxial cable 5. When frequency adjustment ends, the device 1 to be adjusted is disconnected from the coaxial cable 5. Then, a new device 1 to be adjusted is connected to the coaxial cable 5 and frequency adjustment starts.

The frequency adjustment device 10 can be applied to a measurement device such as a spectrum analyzer. The frequency adjustment device 10 includes an input terminal 11, an analog-to-digital converter (ADC) 12, a frequency measurement unit 13, an operation unit 14, a display unit 15, and a display control device 20. The frequency adjustment device 10 includes a microcomputer (not shown) including, for example, a central processing unit (CPU), a read only memory (ROM), a random access memory (RAM), and an input/output circuit connected to various interfaces. The frequency adjustment device 10 executes a control program which is stored in the ROM in advance to cause the microcomputer to function as functional units, such as the ADC 12, the frequency measurement unit 13, the operation unit 14, the display unit 15, and the display control device 20.

The input terminal 11 is connected to the output terminal 4 of the device 1 to be adjusted through the coaxial cable 5 such that a signal is input from the device 1 to be adjusted.

The ADC 12 receives an analog signal input from the device 1 to be adjusted through the input terminal 11, converts the input analog signal within a digital signal, and outputs the digital signal to the frequency measurement unit 13.

The frequency measurement unit 13 measures the frequency of the signal output from the ADC 12, acquires the frequency of the output signal from the device 1 to be adjusted, and outputs data for the acquired frequency to the display control device 20. The frequency measurement unit 13 forms characteristic value acquisition means according to the invention.

The user operates the operation unit 14 to input setting conditions in the adjustment of the frequency of the output signal from the device 1 to be adjusted or to set the display content of the display unit 15. The operation unit 14 includes, for example, an input device, such as a keyboard, a dial, or a mouse, a display that displays, for example, adjustment conditions, and a control circuit or software that controls the input device and the display. The adjustment conditions input to the operation unit 14 include, for example, a minimum frequency and a maximum frequency that indicate a target range of frequency adjustment and a target center frequency of frequency adjustment. In addition, the operation unit 14 forms target range data input means according to the invention.

Figure 2:
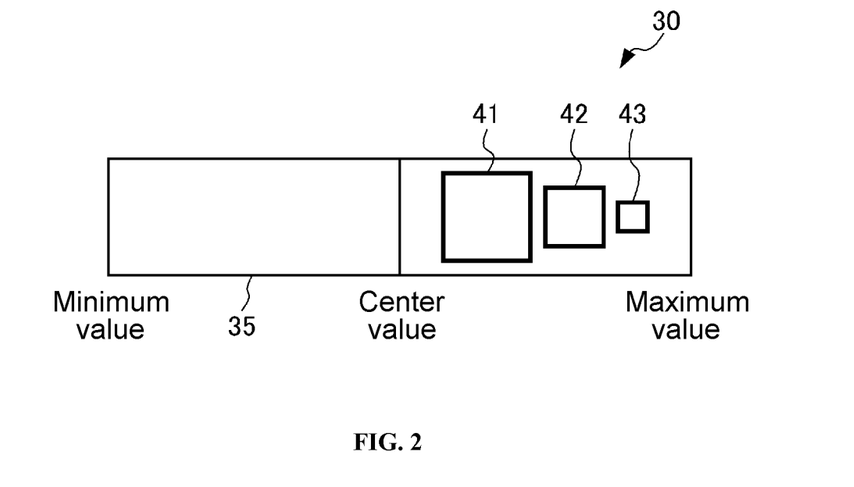
FIG. 2 is a diagram illustrating an example of an adjustment bar displayed by the frequency adjustment device according to the first embodiment of the invention.

The display unit 15 forms display means according to the invention and displays an adjustment bar indicating the adjustment state of the frequency on the basis of the display control of the display control device 20. An example of the adjustment bar is shown in FIG. 2. An adjustment bar 30 shown in FIG. 2 has a rectangular shape in which a longitudinal direction is the horizontal direction and includes a display region 31 in which a mark, which will be described below, is displayed, a minimum value line 32 that indicates the minimum value of the target range, a maximum value line 33 that indicates the maximum value of the target range, a center line 34 that indicates the center value of the target range, and an adjustment axis 35 that indicates a frequency value in the horizontal direction.

The adjustment axis 35 is displayed as any one of a coarse adjustment axis for performing coarse adjustment, a fine adjustment axis for performing fine adjustment, and a medium adjustment axis for performing medium adjustment that is finer than the coarse adjustment and is coarser than the fine adjustment. In this embodiment, the fine adjustment axis is displayed as the adjustment axis 35 on the display unit 15 together with the adjustment bar 30.

The display control device 20 includes an adjustment bar display unit 21, a coarse adjustment mark display unit 22 as second display control means, a medium adjustment mark display unit 23 as third display control means, a fine adjustment mark display unit 24 as first display control means, and a notification unit 25 as notification means.

The adjustment bar display unit 21 displays the adjustment bar 30 and the fine adjustment axis on the display unit 15.

The coarse adjustment mark display unit 22, the medium adjustment mark display unit 23, and the fine adjustment mark display unit 24 perform a display control process of displaying a predetermined mark that moves in the left-right direction in the adjustment bar 30 on the basis of data for the measurement result of the frequency measurement unit 13.

Figure 3:
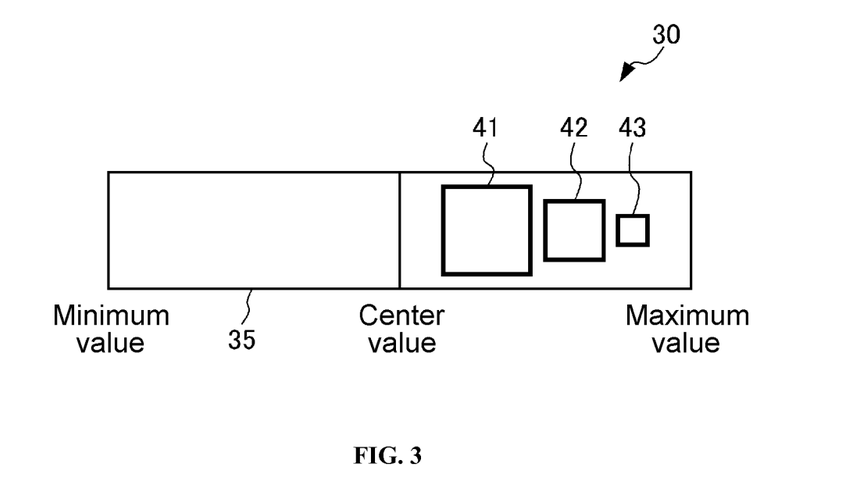
FIG. 3 is a diagram illustrating a mark that moves in the left-right direction in the adjustment bar displayed by the frequency adjustment device according to the first embodiment of the invention.

For example, as shown in FIG. 3, the coarse adjustment mark display unit 22 performs a control process of displaying a coarse adjustment mark 41 for performing coarse adjustment on the adjustment bar 30. The medium adjustment mark display unit 23 performs a control process of displaying a medium adjustment mark 42 for performing medium adjustment on the adjustment bar 30. The fine adjustment mark display unit 24 performs a control process of displaying a fine adjustment mark 43 for performing fine adjustment on the adjustment bar 30. The coarse adjustment mark 41 corresponds to a second mark according to the invention. The medium adjustment mark 42 corresponds to a third mark according to the invention. The fine adjustment mark 43 corresponds to a first mark according to the invention.

The notification unit 25 notifies that the frequency of the output signal from the device 1 to be adjusted is within a predetermined range, for example, a target range.

Figure 4:
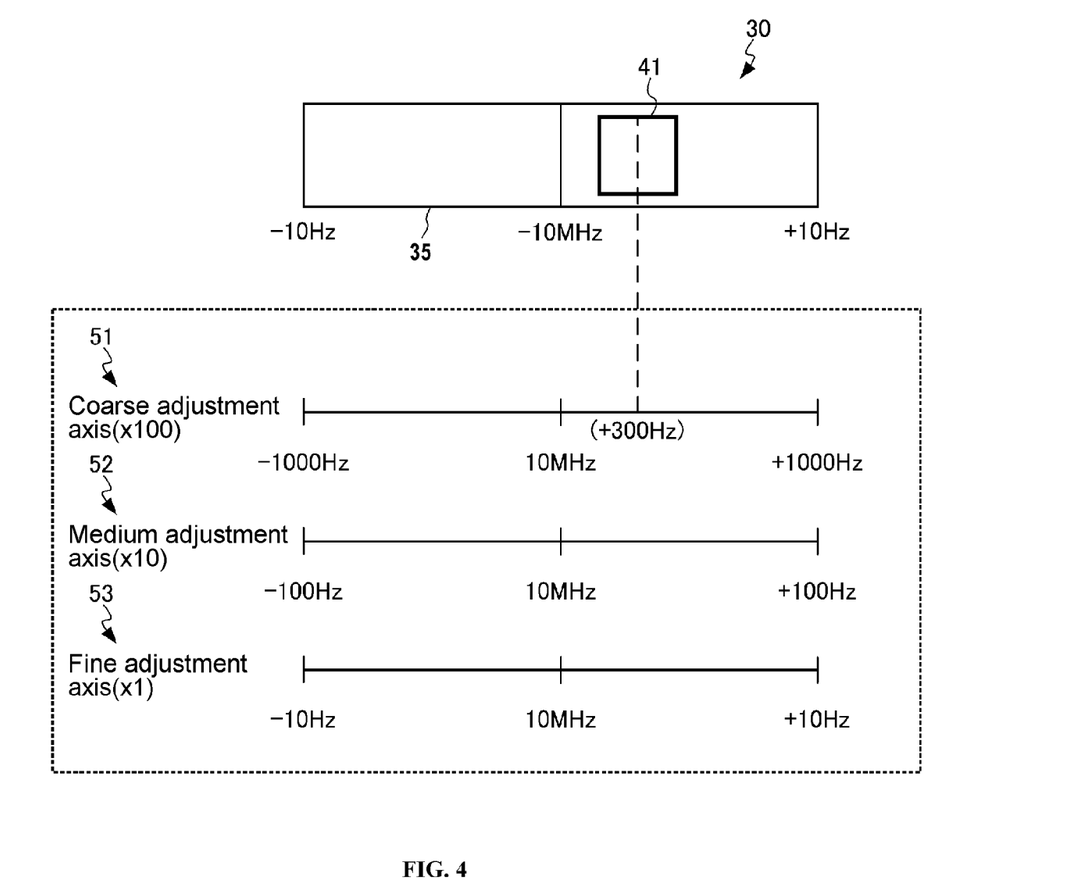
FIG. 4 is a diagram illustrating a coarse adjustment mark displayed by the frequency adjustment device according to the first embodiment of the invention.
Figure 5:
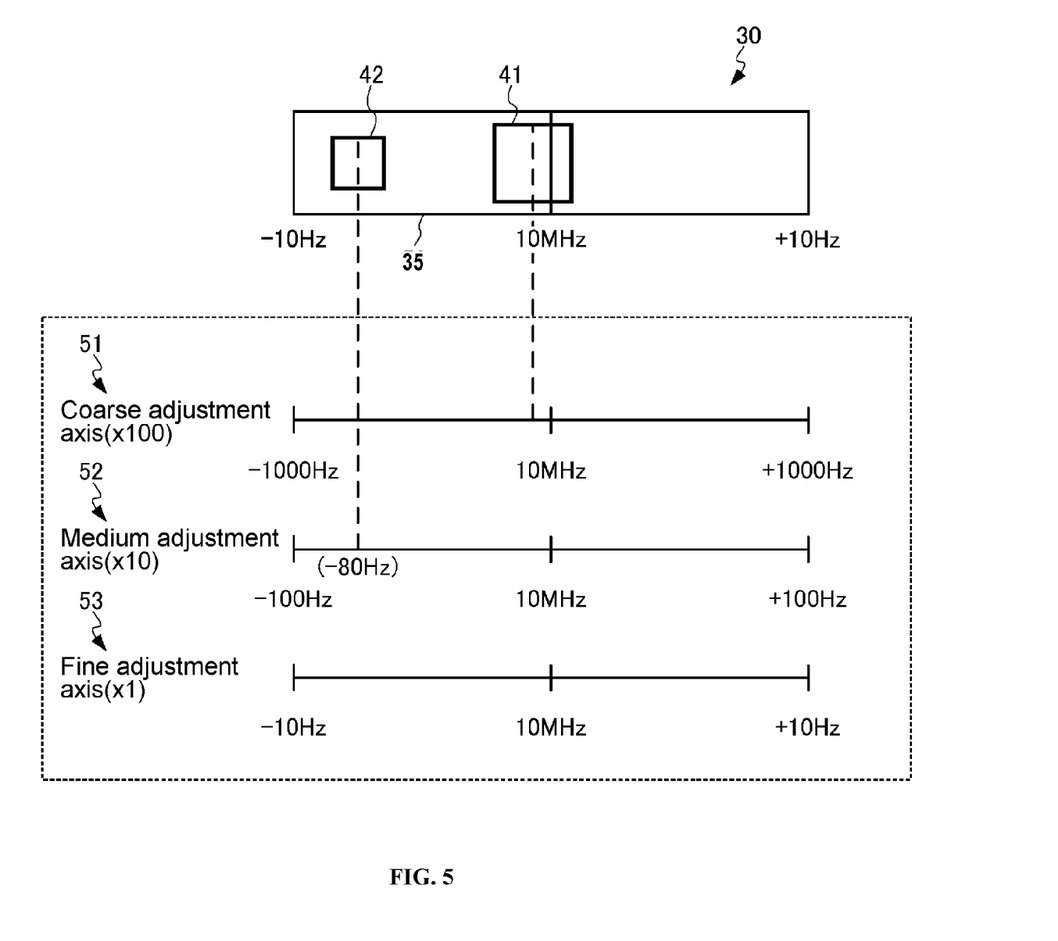
FIG. 5 is a diagram illustrating a medium adjustment mark displayed by the frequency adjustment device according to the first embodiment of the invention.
Figure 6:
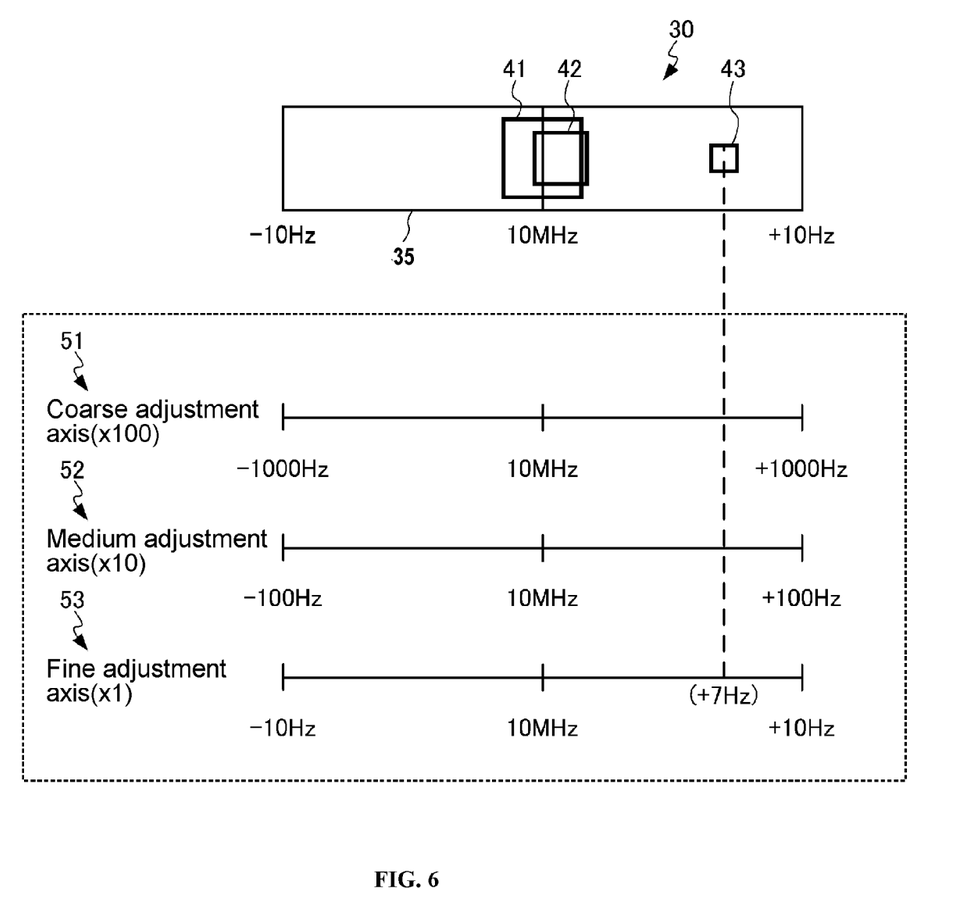
FIG. 6 is a diagram illustrating a fine adjustment mark displayed by the frequency adjustment device according to the first embodiment of the invention.

Next, the functions of the display control device 20 will be described with reference to FIGS. 4 to 6. FIGS. 4 to 6 show the display states of the coarse adjustment mark 41, the medium adjustment mark 42, and the fine adjustment mark 43 on the adjustment bar 30, respectively. In FIGS. 4 to 6, each adjustment axis is displayed in a dotted frame for ease of understanding of description and the display unit 15 is not shown. A coarse adjustment axis 51 as a second axis, a medium adjustment axis 52 as a third axis, and a fine adjustment axis 53 as a first axis are shown in the dotted frame.

In the following description, it is assumed that the minimum value of the target range of an adjustment frequency is −10 Hz, the maximum value of the target range is +10 Hz, the center value of the target range is 10 MHz, and the fine adjustment axis 53 has each of the values. On the medium adjustment axis 52, the minimum value and maximum value of the target range are 10 times greater than those on the fine adjustment axis 53, the minimum value of the target range of the adjustment frequency is −100 Hz, and the maximum value of the target range is +100 Hz. On the coarse adjustment axis 51, the minimum value and maximum value of the target range are 100 times greater than those on the fine adjustment axis 53, the minimum value of the target range of the adjustment frequency is −1000 Hz, and the maximum value of the target range is +1000 Hz.

As shown in FIG. 4, the coarse adjustment mark display unit 22 displays the coarse adjustment mark 41 relative to the coarse adjustment axis 51 on the adjustment bar 30, on the basis of the frequency measured by the frequency measurement unit 13. In the example shown in FIG. 4, the coarse adjustment mark display unit 22 displays the coarse adjustment mark 41 at a position of the adjustment bar 30 which corresponds to the position of a frequency of (10 MHz+300 Hz) on the coarse adjustment axis 51. In this example, since the frequency is out of the range of the medium adjustment axis 52 and the range of the fine adjustment axis 53, the medium adjustment mark 42 and the fine adjustment mark 43 (see FIG. 3) are not displayed on the adjustment bar 30.

Then, as shown in FIG. 5, the medium adjustment mark display unit 23 displays the medium adjustment mark 42 relative to the medium adjustment axis 52 on the adjustment bar 30, on the basis of the frequency measured by the frequency measurement unit 13. In the example shown in FIG. 5, the medium adjustment mark display unit 23 displays the medium adjustment mark 42 at a position of the adjustment bar 30 which corresponds to the position of a frequency of (10 MHz−80 Hz) on the medium adjustment axis 52. Here, the coarse adjustment mark display unit 22 displays the coarse adjustment mark 41 at a position of the adjustment bar 30 which corresponds to the position of a frequency of (10 MHz−80 Hz) on the coarse adjustment axis 51. In this example, since the frequency is beyond the range of the fine adjustment axis 53, the fine adjustment mark 43 (see FIG. 3) is not displayed on the adjustment bar 30.

Then, as shown in FIG. 6, the fine adjustment mark display unit 24 displays the fine adjustment mark 43 relative to the fine adjustment axis 53 on the adjustment bar 30, on the basis of the frequency measured by the frequency measurement unit 13. In the example shown in FIG. 6, the fine adjustment mark display unit 24 displays the fine adjustment mark 43 at a position of the adjustment bar 30 which corresponds to the position of a frequency of (10 MHz+7 Hz) on the fine adjustment axis 53. Here, the coarse adjustment mark display unit 22 displays the coarse adjustment mark 41 at a position of the adjustment bar 30 which corresponds to the position of a frequency of (10 MHz+7 Hz) on the coarse adjustment axis 51. In addition, the medium adjustment mark display unit 23 displays the medium adjustment mark 42 at a position of the adjustment bar 30 which corresponds to the position of a frequency of (10 MHz+7 Hz) on the medium adjustment axis 52.

Figure 7:
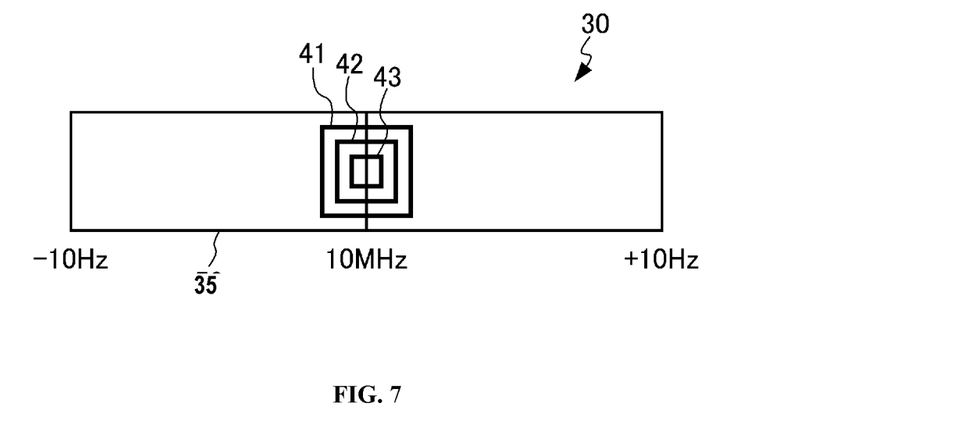
FIG. 7 is a diagram illustrating an example in which the coarse adjustment mark, the medium adjustment mark, and the fine adjustment mark displayed by the frequency adjustment device according to the first embodiment of the invention are aligned with each other.

When the user further adjusts the frequency adjustment unit 3 from the position of a frequency of (10 MHz+7 Hz) shown in FIG. 6 to set the frequency to the center value, the display state shown in FIG. 7 is obtained. That is, the positions of the coarse adjustment mark 41, the medium adjustment mark 42, and the fine adjustment mark 43 in the adjustment axis direction are aligned with each other. In this state, the frequency of the output signal from the device 1 to be adjusted is equal to a center frequency of 10 MHz.

Figure 8:
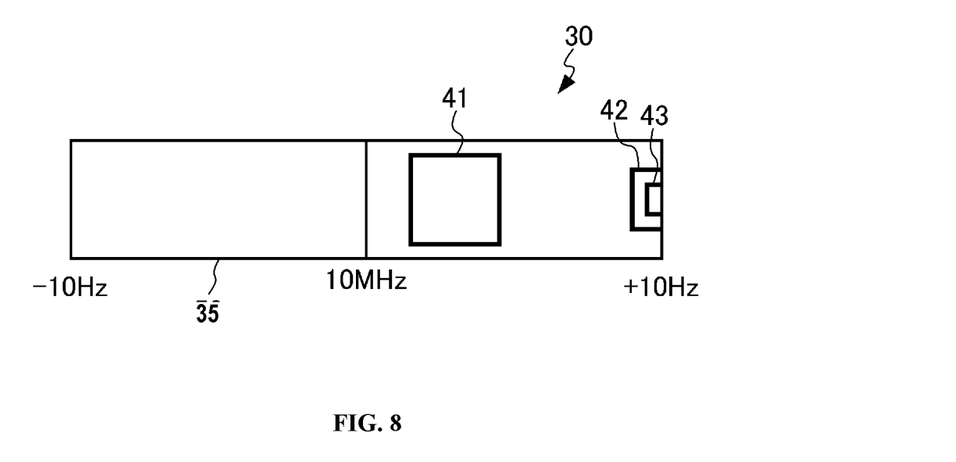
FIG. 8 is a diagram illustrating an example in which the medium adjustment mark and the fine adjustment mark displayed by the frequency adjustment device according to the first embodiment of the invention are displayed at the right end of the adjustment bar.

FIG. 4 shows the example in which only the coarse adjustment mark 41 when the frequency of the output signal from the device 1 to be adjusted is (10 MHz+300 Hz) and the medium adjustment mark 42 and the fine adjustment mark 43 which are out of the range of the adjustment axis are not displayed on the adjustment bar 30. In this case, as shown in FIG. 8, when the medium adjustment mark 42 and the fine adjustment mark 43 are displayed at the right end (positive end) of the adjustment bar 30, the user can recognize that the medium adjustment mark 42 and the fine adjustment mark 43 are disposed in a non-display region on the right side of the adjustment bar 30 and perform adjustment with ease, which is preferable.

In FIG. 6, for example, the notification unit 25 may display the coarse adjustment mark 41, the medium adjustment mark 42, and the fine adjustment mark 43 so as to blink, or may change the color of each mark or the background color of the adjustment bar 30 to be different from that before the marks fall within the target range, on the condition that the frequency of the output signal from the device 1 to be adjusted falls within the target range. According to this structure, the frequency adjustment device 10 according to this embodiment enables the user to easily recognize that the frequency of the output signal from the device 1 to be adjusted falls within the target range.

Figure 9:
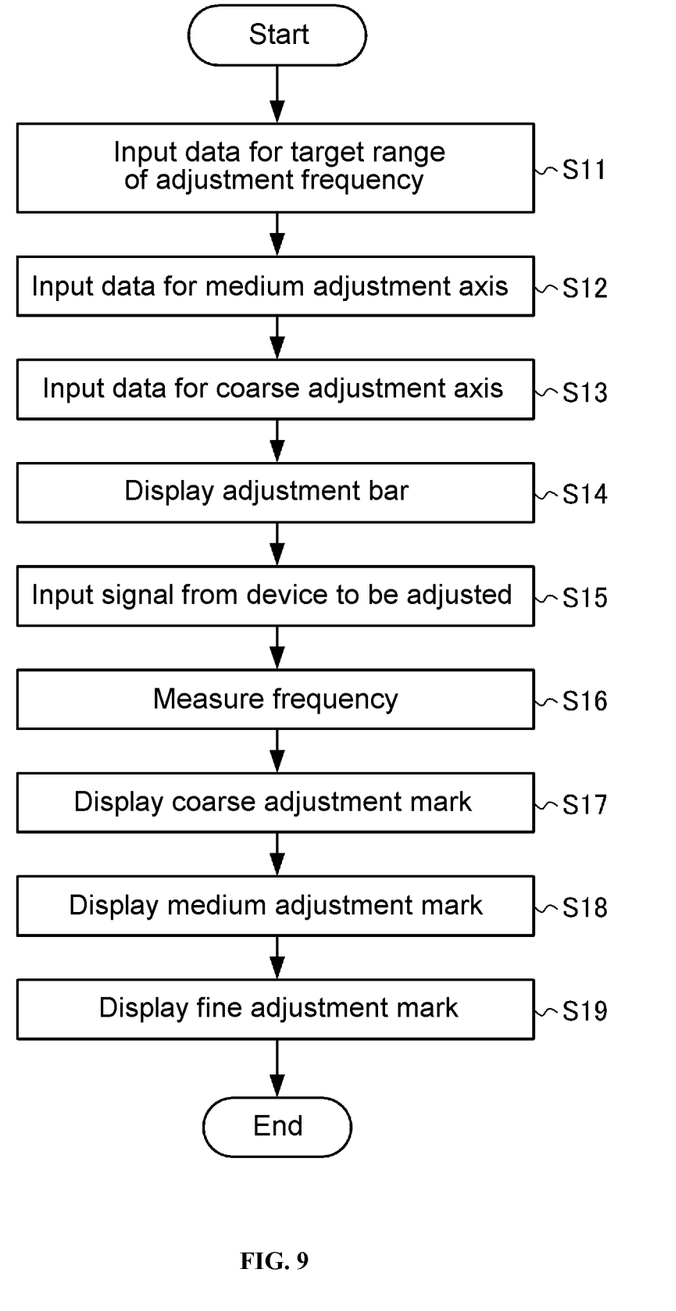
FIG. 9 is a flowchart illustrating the operation of the frequency adjustment device according to the first embodiment of the invention.

Next, the operation of the frequency adjustment device 10 according to this embodiment will be described with reference to the flowchart shown in FIG. 9.

The user operates the operation unit 14 to input the target range of the adjustment frequency (Step S11). In this embodiment, as data for the target range, the minimum value of the target frequency is −10 Hz, the maximum value of the target frequency is +10 Hz, and the target center frequency is 10 MHz. As shown in FIG. 4, the data for the target range is set as the minimum value, the maximum value, and the center value of the fine adjustment axis 53 (see FIG. 4).

Then, the user operates the operation unit 14 to input data for the medium adjustment axis 52 (Step S12). In this embodiment, the minimum value of the medium adjustment axis 52 is −100 Hz, the maximum value of the medium adjustment axis 52 is +100 Hz, and the target center frequency is 10 MHz (see FIG. 4).

In addition, the user operates the operation unit 14 to input data for the coarse adjustment axis 51 (Step S13). In this embodiment, the minimum value of the coarse adjustment axis 51 is −1000 Hz, the maximum value of the coarse adjustment axis 51 is +1000 Hz, and the target center frequency is 10 MHz (see FIG. 4).

The adjustment bar display unit 21 displays the adjustment bar 30 on the display unit 15 (Step S14). Here, the fine adjustment axis 53 attached to the adjustment bar 30 is displayed on the display unit 15 (see FIG. 4).

The frequency adjustment device 10 receives a signal from the device 1 to be adjusted (Step S15). The ADC 12 converts the received signal from an analog signal to a digital signal and the converted signal is input to the frequency measurement unit 13.

The frequency measurement unit 13 measures the frequency of the input signal (Step S16).

The coarse adjustment mark display unit 22 displays the coarse adjustment mark 41 relative to the coarse adjustment axis 51 on the basis of the frequency value measured by the frequency measurement unit 13 (Step S17). When the frequency of the output signal from the device 1 to be adjusted is in the range of −1000 Hz to +1000 Hz by the adjustment of the frequency adjustment unit 3, the coarse adjustment mark 41 is displayed in the adjustment bar 30.

The medium adjustment mark display unit 23 displays the medium adjustment mark 42 relative to the medium adjustment axis 52 on the basis of the frequency value measured by the frequency measurement unit 13 (Step S18). When the frequency of the output signal from the device 1 to be adjusted is in the range of −100 Hz to +100 Hz by the adjustment of the frequency adjustment unit 3, the medium adjustment mark 42 is displayed in the adjustment bar 30.

The fine adjustment mark display unit 24 displays the fine adjustment mark 43 relative to the fine adjustment axis 53 on the basis of the frequency value measured by the frequency measurement unit 13 (Step S19). When the frequency of the output signal from the device 1 to be adjusted is in the range of −10 Hz to +10 Hz by the adjustment of the frequency adjustment unit 3, the fine adjustment mark 43 is displayed in the adjustment bar 30. In this case, the notification unit 25 notifies that the frequency of the output signal from the device 1 to be adjusted is within the target range.

As described above, the frequency adjustment device 10 according to this embodiment has the structure in which the coarse adjustment mark 41, the medium adjustment mark 42, and the fine adjustment mark 43 are displayed in the adjustment bar 30 to perform coarse adjustment, medium adjustment, and fine adjustment for the frequency. Therefore, the user can adjust the frequency as if the user adjusts the frequency with an analog meter. Therefore, the frequency adjustment device 10 according to this embodiment enables the user to easily adjust the frequency of the output signal from the device 1 to be adjusted within the target range with a simple operation.

In the above-described embodiment, the coarse adjustment axis 51 and the medium adjustment axis 52 are weighted on the basis of the fine adjustment axis 53. However, the invention is not limited thereto. For example, the weighting may be performed on the basis of the coarse adjustment axis 51 or the medium adjustment axis 52. In this case, the same effect as described above is obtained.

In the above-described embodiment, the frequency is adjusted using three adjustment axes, that is, the coarse adjustment axis 51, the medium adjustment axis 52, and the fine adjustment axis 53. However, the invention is not limited thereto. For example, the frequency may be adjusted using two axes, that is, the coarse adjustment axis 51 and the fine adjustment axis 53. In addition, four or more adjustment axes may be provided and the frequency may be adjusted using the four or more adjustment axes.

In the above-described embodiment, the frequency is used as the characteristic value of the electrical characteristic according to the invention. However, the invention is not limited thereto. The characteristic value of electrical characteristic other than the frequency, for example, a voltage value, may be adjusted. In this case, the same effect as described above is obtained.

In the above-described embodiment, the mark has a rectangular shape. However, the invention is not limited thereto. For example, the mark may have a circular shape, an elliptical shape, or other polygonal shapes, or it may be a symbol. In this case, the same effect as described above is obtained.

Second Embodiment

First, the structure of a frequency adjustment device as an electrical characteristic adjustment device according to a second embodiment of the invention will be described.

Figure 10:
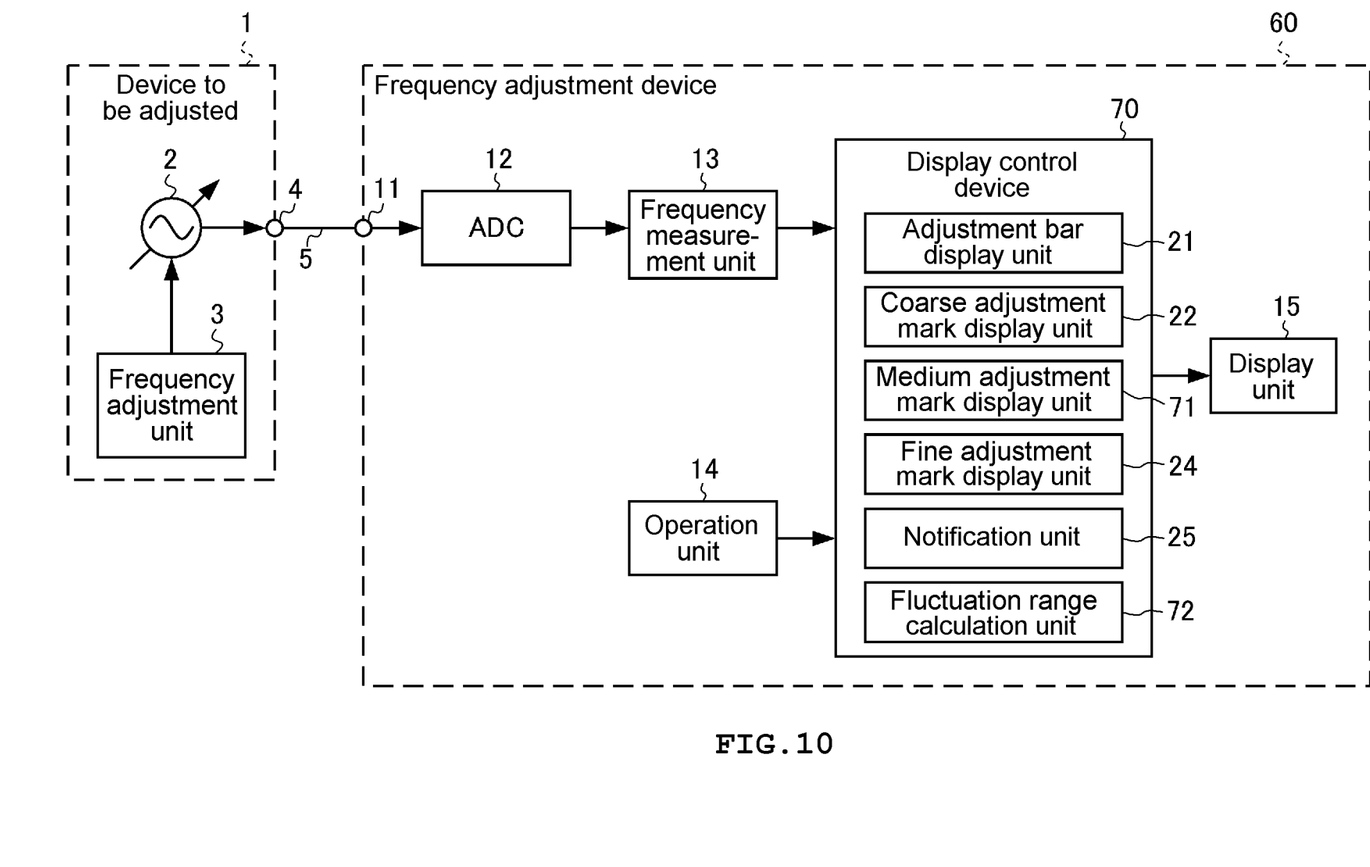
FIG. 10 is a block diagram illustrating the structure of a frequency adjustment device according to a second embodiment of the invention.

As shown in FIG. 10, a frequency adjustment device 60 according to this embodiment is a display control device 70 obtained by changing a portion of the display control device 20 of the frequency adjustment device 10 (see FIG. 1) according to the first embodiment. Therefore, the same components as those in the first embodiment are denoted by the same reference numerals and the description thereof will not be repeated.

The display control device 70 according to this embodiment includes a fine adjustment mark display unit 71 as first display control means and a fluctuation range calculation unit 72 as fluctuation range calculation means.

The fine adjustment mark display unit 71 displays a mark on the basis of a calculation value calculated by the fluctuation range calculation unit 72.

The fluctuation range calculation unit 72 receives data for the frequency value acquired by a frequency measurement unit 13 and calculates the fluctuation range of the received frequency value on a fine adjustment axis 53.

Figure 11:
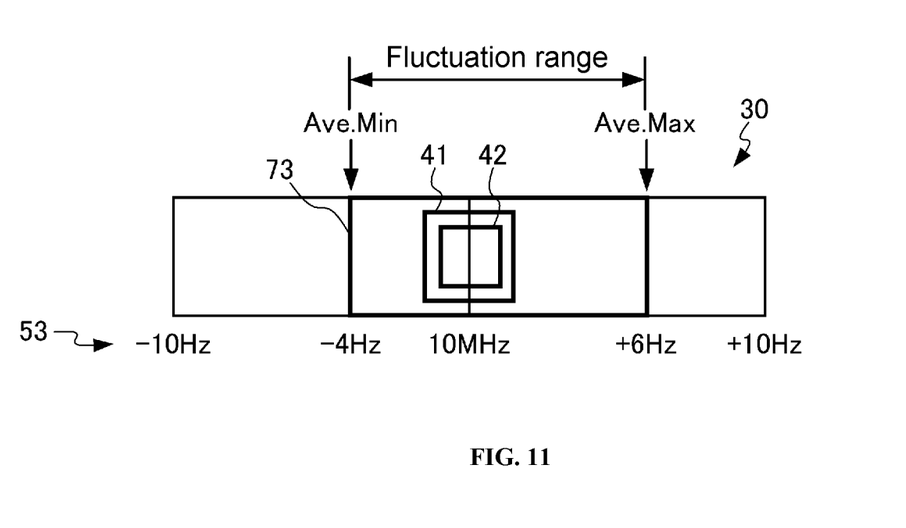
FIG. 11 is a diagram illustrating a fluctuation range of the frequency adjustment device according to the second embodiment of the invention.

Specifically, as shown in FIG. 11, when the frequency value varies on the fine adjustment axis 53, the fluctuation range calculation unit 72 calculates the average value (Ave.Min) of small frequency values and the average value (Ave.Max) of large frequency values and calculates the fluctuation range of the frequency on the fine adjustment axis 53. Each average value is calculated from, for example, ten previous frequency values. FIG. 11 shows an example of a display state when the frequency is adjusted. In the example, a mark 73 displayed by the fine adjustment mark display unit 71 indicates that the fluctuation range is from −4 Hz to +6 Hz.

Figure 12:
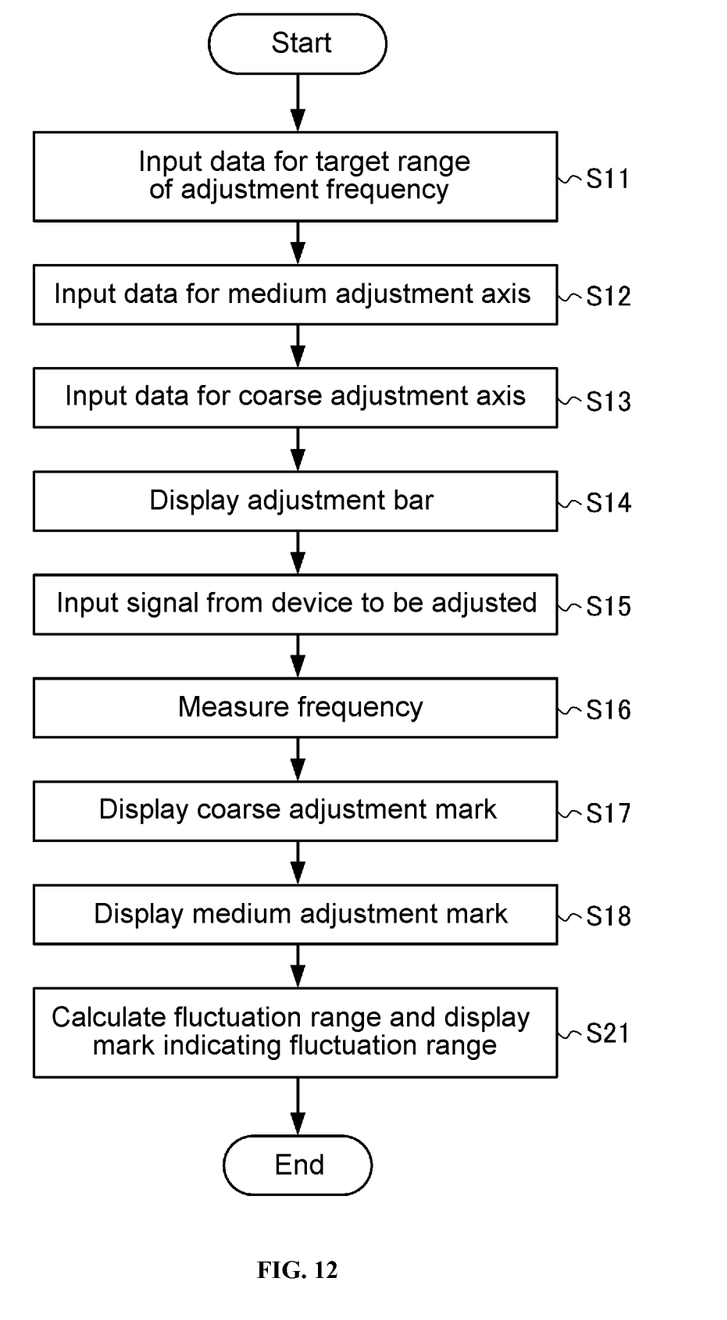
FIG. 12 is a flowchart illustrating the operation of the frequency adjustment device according to the second embodiment of the invention.

Next, the operation of the frequency adjustment device 60 according to the second embodiment of the invention will be described with reference to FIG. 12. In the second embodiment, the flowchart differs from the flowchart (see FIG. 9) in the first embodiment only in Step S21. Therefore, the description of Steps S11 to S18 will not be repeated.

In Step 21, the fluctuation range calculation unit 72 receives data for the frequency value acquired by the frequency measurement unit 13 and calculates the fluctuation range of the received frequency value on the fine adjustment axis 53. The fine adjustment mark display unit 71 displays the mark 73 on the basis of the values (Ave.Min and Ave.Max) calculated by the fluctuation range calculation unit 72.

According to the above-mentioned structure, even when the device 1 to be adjusted in which the frequency is less likely to be stabilized is adjusted, the frequency adjustment device 60 according to this embodiment enables the user to instinctively read the fluctuation range of the frequency or the center value of the fluctuation range. Therefore, the user can easily adjust the frequency value within the target range with a simple operation.

INDUSTRIAL APPLICABILITY

As such, the electrical characteristic adjustment device and the electrical characteristic adjustment method according to the invention have the effect of enabling a user to easily adjust a predetermined characteristic value within the target range with a simple operation and are useful as an electrical characteristic adjustment device and an electrical characteristic adjustment method that adjust a predetermined characteristic value of a device to be adjusted, which can change electrical characteristic, within a target range.

DESCRIPTION OF REFERENCE NUMERALS AND SIGNS 10, 60: FREQUENCY ADJUSTMENT DEVICE (ELECTRICAL CHARACTERISTIC ADJUSTMENT DEVICE)
13: FREQUENCY MEASUREMENT UNIT (CHARACTERISTIC VALUE ACQUISITION MEANS)
14: OPERATION UNIT (TARGET RANGE DATA INPUT MEANS)
15: DISPLAY UNIT (DISPLAY MEANS)
20, 70: DISPLAY CONTROL DEVICE
21: ADJUSTMENT BAR DISPLAY UNIT
22: COARSE ADJUSTMENT MARK DISPLAY UNIT (SECOND DISPLAY CONTROL MEANS)
23: MEDIUM ADJUSTMENT MARK DISPLAY UNIT (THIRD DISPLAY CONTROL MEANS)
24: FINE ADJUSTMENT MARK DISPLAY UNIT (FIRST DISPLAY CONTROL MEANS)
25: NOTIFICATION UNIT (NOTIFICATION MEANS)
30: ADJUSTMENT BAR
41: COARSE ADJUSTMENT MARK (SECOND MARK)
42: MEDIUM ADJUSTMENT MARK (THIRD MARK)
43: FINE ADJUSTMENT MARK (FIRST MARK)
51: COARSE ADJUSTMENT AXIS (SECOND AXIS)
52: MEDIUM ADJUSTMENT AXIS (THIRD AXIS)
53: FINE ADJUSTMENT AXIS (FIRST AXIS)
71: FINE ADJUSTMENT MARK DISPLAY UNIT (FIRST DISPLAY CONTROL MEANS)
72: FLUCTUATION RANGE CALCULATION UNIT (FLUCTUATION RANGE CALCULATION MEANS)
73: MARK

What is claimed is:

1. An electrical characteristic adjustment device for adjusting a characteristic value of an electrical characteristic within a target range, comprising:
a microcomputer configured to receive a signal from a device to be adjusted, which can change the electrical characteristic, measure the signal, and acquire the characteristic value of the electrical characteristic;
an input interface for inputting data for a first minimum value and a first maximum value indicating the target range of the characteristic value; and
a display for displaying a first mark and a second mark, the first and second marks indicating the acquired characteristic value based on their location on an adjustment axis, the location of the first mark on the adjustment axis indicating a value according to a first range of values based on a first scale and the location of the second mark on the adjustment axis indicating a value according to a second range of values based on a second scale,
the microcomputer being further configured to:
control the display of the first mark on the adjustment axis according to the first range of values and the first scale; and
control the display of the second mark on the adjustment axis according to the second range of values and the second scale, wherein
the first range of values is larger than the second range of values,
the first scale is smaller than the second scale such that the first range of values and the second range of values occupy the same distance on the adjustment axis, a target value is included within both the first range of values and the second range of values, when the characteristic value is equal to the target value, the first mark and the second mark overlap each other on the adjustment axis such that a center point of the first mark is the same as a center point of the second mark, and the location of the first mark on the adjustment axis is independent of the location of the second mark on the adjustment axis.

2. The electrical characteristic adjustment device according to claim 1, the microcomputer being further configured to:

control the display such that a third mark indicating the acquired characteristic value is displayed, the location of the third mark on the adjustment axis indicating a value according to a third range of values based on a third scale, wherein the third range of values is smaller than the second range of values, the third scale is smaller than the second scale such that the third range of values and the second range of values occupy the same distance on the adjustment axis, the target value is also included within the third range of values, and the location of the target value on the adjustment axis according to the third scale is the same as the location of the target value on the adjustment axis according to the first and second scales.

3. The electrical characteristic adjustment device according to claim 1, the microcomputer being further configured to calculate a fluctuation range of the acquired characteristic value on the adjustment axis, wherein the microcomputer controls the display to display a mark indicating the fluctuation range.

4. The electrical characteristic adjustment device according to claim 2, the microcomputer being further configured to calculate a fluctuation range of the acquired characteristic value on the adjustment axis, wherein the microcomputer controls the display to display a mark indicating the fluctuation range.

5. The electrical characteristic adjustment device according to claim 1, the microcomputer being further configured to notify that the acquired characteristic value is within a predetermined adjustment range.

6. The electrical characteristic adjustment device according to claim 2, the microcomputer being further configured to notify that the acquired characteristic value is within a predetermined adjustment range.

7. The electrical characteristic adjustment device according to claim 3, the microcomputer being further configured to notify that the acquired characteristic value is within a predetermined adjustment range.

8. An electrical characteristic adjustment method for adjusting a characteristic value of an electrical characteristic within a target range, comprising:

receiving a signal from a device to be adjusted, which can change the electrical characteristic;

measuring the signal;

acquiring the characteristic value of the electrical characteristic;

receiving input data for a first minimum value and a first maximum value indicating the target range of the characteristic value; and displaying a first mark and a second mark, the first and second marks indicating the acquired characteristic value based on their locations on an adjustment axis, the location of the first mark on the adjustment axis indicating a value according to a first range of values based on a first scale and the location of the second mark on the adjustment axis indicating a value according to a second range of values based on a second scale, wherein the first range of values is larger than the second range of values, the first scale is smaller than the second scale such that the first range of values and the second range of values occupy the same distance on the adjustment axis, a target value is included within both the first range of values and the second range of values, when the characteristic value is equal to the target value, the first mark and the second mark overlap each other on the adjustment axis such that a center point of the first mark is the same as a center point of the second mark, and the location of the first mark on the adjustment axis is independent of the location of the second mark on the adjustment axis.

9. The electrical characteristic adjustment method according to claim 8, further comprising:

displaying a third mark indicating the acquired characteristic, the location of the third mark on the adjustment axis indicating a value according to a third range of values based on a third scale, wherein the third range of values is smaller than the second range of values, the third scale is smaller than the second scale such that the third range of values and the second range of values occupy the same distance on the adjustment axis, the target value is also included within the third range of values, and the location of the target value on the adjustment axis according to the third scale is the same as the location of the target value on the adjustment axis according to the first and second scales.

10. The electrical characteristic adjustment method according to claim 8, further comprising:

calculating a fluctuation range of the acquired characteristic value on the adjustment axis, and displaying a mark indicating the fluctuation range.

11. The electrical characteristic adjustment method according to claim 9, further comprising:

calculating a fluctuation range of the acquired characteristic value on the adjustment axis, and displaying a mark indicating the fluctuation range.

\* \* \* \* \*